(12) United States Patent
Bills et al.

(10) Patent No.: US 10,305,247 B2
(45) Date of Patent: May 28, 2019

(54) RADIATION SOURCE WITH A SMALL-ANGLE SCANNING ARRAY

(71) Applicant: APPLE INC., Cupertino, CA (US)

(72) Inventors: Richard E. Bills, San Jose, CA (US); Andrew J. Sutton, Sunnyvale, CA (US); Cristiano L. Niclass, San Jose, CA (US); Mina A. Rezk, Haymarket, VA (US)

(73) Assignee: APPLE INC., Cupertino, CA (US)

( * ) Notice: Subject to any disclaimer, the term of this patent is extended or adjusted under 35 U.S.C. 154(b) by 381 days.

(21) Appl. No.: 15/250,962

(22) Filed: Aug. 30, 2016

(65) Prior Publication Data

US 2018/0062345 A1  Mar. 1, 2018

(51) Int. Cl.

| G01C 3/08 | (2006.01) |
|---|---|
| H01S 5/00 | (2006.01) |
| G01S 7/481 | (2006.01) |
| G01S 17/10 | (2006.01) |
| G02B 26/08 | (2006.01) |
| G02F 1/29 | (2006.01) |
| H01S 5/42 | (2006.01) |
| G01S 17/42 | (2006.01) |
| H01S 5/042 | (2006.01) |

(52) U.S. Cl.
CPC .......... *H01S 5/0071* (2013.01); *G01S 7/4815* (2013.01); *G01S 7/4817* (2013.01); *G01S 17/10* (2013.01); *G01S 17/42* (2013.01); *G02B 26/0816* (2013.01); *G02B 26/0891* (2013.01); *G02F 1/292* (2013.01); *H01S 5/423* (2013.01); *H01S 5/042* (2013.01)

(58) Field of Classification Search
CPC ...... G01S 7/4817; G01S 7/4815; G01S 17/10; G01S 17/42; H01S 5/042; H01S 5/0071; H01S 5/423; G02B 26/0816; G02B 26/0891
USPC ........................................................ 356/5.01
See application file for complete search history.

(56) References Cited

U.S. PATENT DOCUMENTS

| 5,552,893 A | 9/1996 | Akasu |
|---|---|---|
| 5,677,970 A | 10/1997 | Nashimoto |

(Continued)

FOREIGN PATENT DOCUMENTS

DE   10146692 A1   4/2003

OTHER PUBLICATIONS

International Application # PCT/US2017/039163 search report dated Sep. 29, 2017.

(Continued)

*Primary Examiner* — Mark Hellner
(74) *Attorney, Agent, or Firm* — Kligler & Associates

(57) ABSTRACT

An optical apparatus includes an array of lasers, which are arranged in a grid pattern having a predefined spatial pitch and are configured to emit respective beams of pulses of optical radiation. Projection optics having a selected focal length project the beams toward a target with an angular pitch between the beams defined by the spatial pitch and the focal length. A scanner scans the projected beams over a range of scan angles that is less than twice the angular pitch. Control circuitry drives the lasers and the scanner so that the pulses cover the target with a resolution finer than the angular pitch. A receiver receives and measures a time of flight of the pulses reflected from the target.

18 Claims, 7 Drawing Sheets

(56) References Cited

U.S. PATENT DOCUMENTS

| | | | |
|---|---|---|---|
| 5,808,656 A | 9/1998 | Goldmann | |
| 6,680,788 B1 * | 1/2004 | Roberson | G02B 26/0875 |
| | | | 359/199.2 |
| 9,268,012 B2 | 2/2016 | Ghosh et al. | |
| 9,325,973 B1 | 4/2016 | Hazeghi et al. | |
| 9,553,423 B2 | 1/2017 | Chen et al. | |
| 9,826,216 B1 | 11/2017 | Hazeghi et al. | |
| 9,981,604 B2 * | 5/2018 | Sakai | G01S 7/4815 |
| 2007/0181810 A1 | 8/2007 | Tan et al. | |
| 2015/0219764 A1 | 8/2015 | Lipson | |
| 2016/0025993 A1 | 1/2016 | Mor et al. | |
| 2017/0176249 A1 | 6/2017 | Fournier et al. | |

OTHER PUBLICATIONS

Niclass et al., "Design and characterization of a 256x64-pixel single-photon imager in CMOS for a MEMSbased laser scanning time-of-flight sensor", Optics Express, vol. 20, No. 11, pp. 11863-11881, May 10, 2012.

Niclass et al., "A Single Photon Detector Array with 64×64 Resolution and Millimetric Depth Accuracy for 3D Imaging", ISSCC 2005 / Session 19 / Imagers / 19.10, 3 pages, Feb. 8, 2005.

U.S. Appl. No. 15/597,166 Ex-parte Quayle Action dated Jan. 22, 2019.

\* cited by examiner

RADIATION SOURCE WITH A SMALL-ANGLE SCANNING ARRAY

FIELD OF THE INVENTION

The present invention relates generally to optical systems, and particularly to high-resolution optical scanning and depth mapping.

BACKGROUND

Existing and emerging consumer applications have created an increasing need for real-time three-dimensional imagers. These imaging devices, also commonly known as light detection and ranging (LiDAR) sensors, enable the remote measurement of distance (and often intensity) of each point on a target scene—so-called target scene depth—by illuminating the target scene with an optical beam and analyzing the reflected optical signal. A commonly used technique to determine the distance to each point on the target scene involves sending an optical beam towards the target scene, followed by the measurement of the round-trip time, i.e. time-of-flight (ToF), taken by the optical beam as it travels from the source to target scene and back to a detector adjacent to the source.

SUMMARY

Embodiments of the present invention that are described hereinbelow provide apparatus and methods for scanning arrays of beams of radiation with high resolution.

There is therefore provided, in accordance with an embodiment of the present invention, an optical apparatus, including an array of lasers, which are arranged in a grid pattern having a predefined spatial pitch and are configured to emit respective beams of pulses of optical radiation. Projection optics having a selected focal length are configured to project the beams toward a target with an angular pitch between the beams defined by the spatial pitch and the focal length. A scanner is configured to scan the projected beams over a range of scan angles that is less than twice the angular pitch. Control circuitry is coupled to drive the lasers and the scanner so that the pulses cover the target with a resolution finer than the angular pitch. A receiver is configured to receive and measure a time of flight of the pulses reflected from the target.

In a disclosed embodiment, the array of lasers includes a semiconductor substrate and an array of vertical-cavity surface-emitting lasers (VCSELs) formed on the substrate, which are configured to emit the optical radiation.

In some embodiments, the projection optics include a lens, and the scanner is configured to scan the projected beams by translating the lens transversely with respect to the beams.

In other embodiments, the scanner is configured to scan the projected beams by applying a motion to the array of lasers relative to the projection optics. In a disclosed embodiment, the motion includes translating the array of lasers transversely relative to a direction of the beams. In another disclosed embodiment, the motion includes rotating the array of lasers around a rotational axis in a plane of the array of the lasers.

In other embodiments, the scanner includes a rotating mirror positioned to deflect the projected beams at a variable deflection angle.

In still other embodiments, the scanner includes a grating positioned to diffract the beams at a variable diffraction angle. In a disclosed embodiment, the grating includes an electro-optical spatial light modulator, which is configured to generate the grating with a variable period and orientation.

In other embodiments, the scanner includes at least one prism, which is positioned to intercept and refract the beams and is movable relative to the array so as to vary an angle of deviation of the refracted beams. In a disclosed embodiment, the at least one prism includes a pair of wedge prisms configured as a Risley prism.

In still other embodiments, the control circuitry is configured to drive the lasers to emit the pulses in a pseudo-random spatio-temporal pattern.

There is also provided, in accordance with an embodiment of the present invention, a method for scanning. The method includes projecting, toward a target from an array of lasers arranged in a grid pattern, respective beams of pulses of optical radiation with a predefined angular pitch between the beams. The projected beams are scanned over a range of scan angles that is less than twice the angular pitch, while driving the lasers so that the pulses cover the target with a resolution finer than the angular pitch, and receiving and measuring a time of flight of the pulses reflected from the target.

The present invention will be more fully understood from the following detailed description of the embodiments thereof, taken together with the drawings in which:

DETAILED DESCRIPTION OF EMBODIMENTS

Overview

Figure 1:
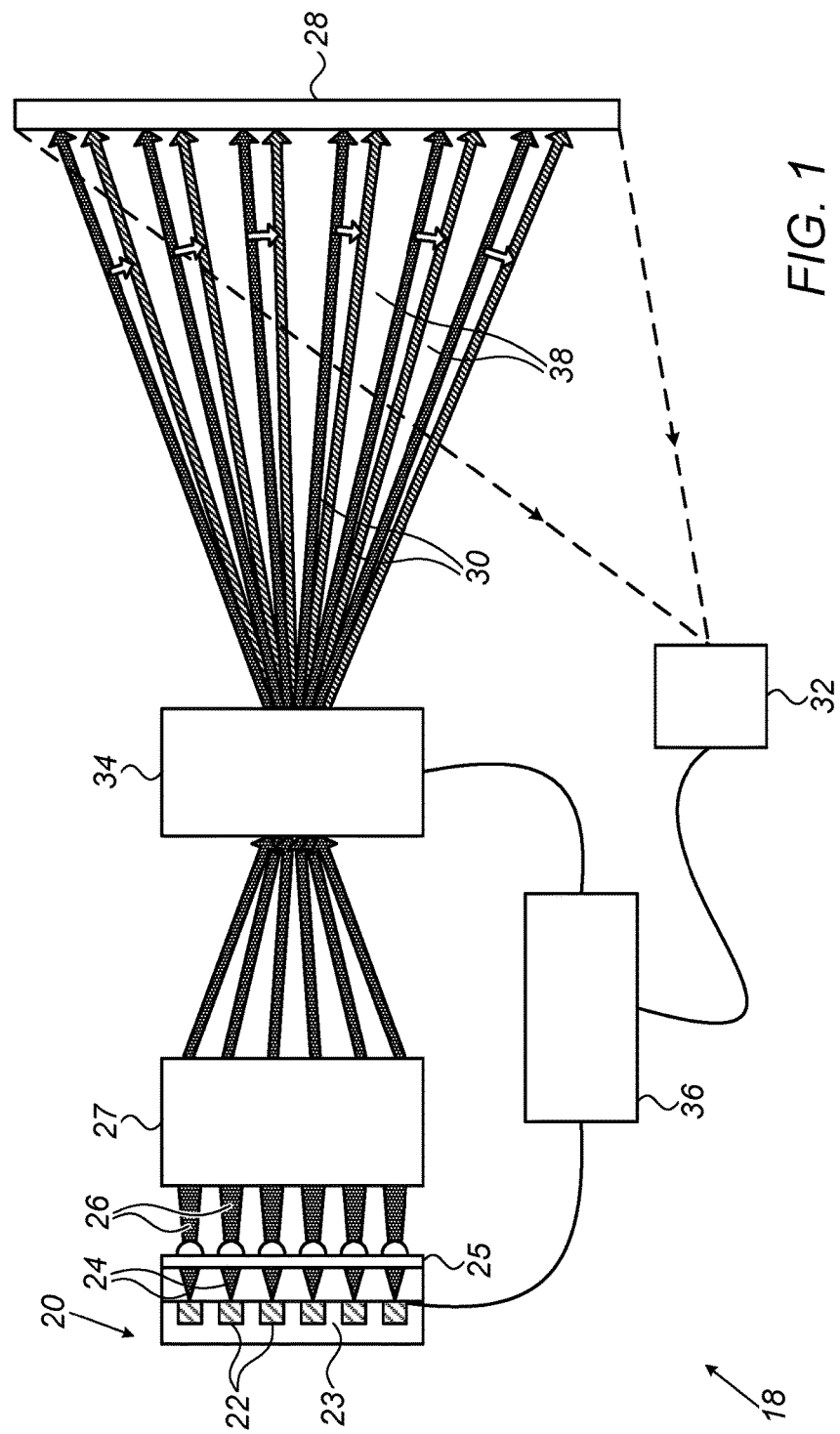
FIG. 1 is a schematic side view of apparatus for depth mapping, in accordance with an embodiment of the invention.

LiDAR sensors measure the distance to each point on a target scene (target scene depth) by illuminating the target scene with one or more optical beams and analyzing the reflected optical signals. In outdoor applications in particular, a major challenge to the irradiance of the LiDAR illumination is presented by uncorrelated background light, such as solar ambient light, typically reaching a spectral irradiance of 1 W/(m$^2$-nm). This challenge is met by using pulsed laser arrays with high-radiance emitted beams, such as an array of high-intensity vertical-cavity surface-emitting lasers (VCSELs), yielding an irradiance on the target scene exceeding the level of the uncorrelated background irradiance. This, in turn, leads to a high ratio of signal to background, as well as to a high ratio of signal to noise in detection of the beams.

By optically spreading the beams emitted by a pulsed laser array, a large area of a target scene is illuminated. However, with a given, spatially static array of illuminating beams, the lateral spatial resolution (i.e., the resolution in planes transverse to the beam axes) of the target scene depth measurement is determined (and limited) by the pitch of the beam array.

The embodiments of the present invention that are described herein address the above limitation so as to enable compact, reliable, robust, and low-cost LiDAR sensors for depth imaging with high lateral spatial resolution. In the disclosed embodiments, a high lateral spatial resolution of the target scene depth measurement is achieved by angularly scanning in unison the beams emitted by the pulsed laser array. A small-angle angular scan is sufficient, as for a given array of illuminating beams the angular scan amplitude does not need to exceed the angular pitch of the array (although in some cases it may be advantageous to be capable of scanning over a slightly larger range, for example up to twice the angular pitch). This combination of an optical separation of the beams and a small-angle angular scan achieves a coverage of the entire extent of the target scene, as well as a high spatial resolution. This sort of small-angle scan is useful in reducing the mechanical and optical demands on the scanner, and concomitantly enhancing scanner reliability.

Another advantage is achieved by scanning the pulsed laser beams so that each beam at each scan position irradiates exactly one individual detector in the detector array of the receiver of the LiDAR: The signal-to-noise ratio (SNR) and signal-to-background ratio (SBR) for the sensing are much higher than if each beam were spread over multiple detectors of the detector array. These high SNR and SBR values enable a robust distance mapping by the LiDAR even under strong uncorrelated background light, as described above, while operating the pulsed laser array at an optimally low power level.

In the disclosed embodiments, the illumination of the target scene comprises two major aspects:

1) The grid of laser beams, together with the small-angle scan, defines a grid of illumination spots on the target scene. An example of such a grid is an orthogonal raster array, with its spatial pitch defined by the scanner; and
2) the individual lasers in the array are each separately and independently driven by control circuitry to emit a sequence of pulses to fill selectively the grid of illumination spots. This sequence may be either random, pseudo-random, or cyclic, and it may be different for each individual laser.

These two aspects enable illuminating the target scene in various spatio-temporal patterns by appropriate synchronization between the pulsed laser array and the scanner. The synchronization is governed by the control circuitry, which drives both the pulsed laser array and the scanner and defines which laser (or lasers) are fired at a given scanner position. The following two examples describe some of the alternatives:

a) By driving the individual lasers in a random or pseudo-random sequence, the pulses on the target scene "seen" by the receiver are both spatially and temporally random or pseudo-random. Such a random or pseudo-random spatio-temporal patterns mitigate potential interference from other LiDAR sensors in the vicinity; or
b) by driving the individual lasers in a cyclic time-sequence, the pulses generated on the target scene may be either cyclic spatio-temporal patterns, such as a raster scan, or patterns which are spatially irregular but temporally cyclic. By restricting these cyclic pulse patterns spatially to a subset or sub-region of the pulsed laser array, the LiDAR sensor will rapidly collect depth sensing data from the corresponding region of interest within the scene.

A small-angle angular scan enables utilizing compact scanning components. These components, for instance piezoelectric flexure translators, MEMS (Micro-Electro-Mechanical System) mirrors, and electro-optical modulators, have long lifetimes, and they are well-suited for scaling to production in high volumes. A small-angle angular scan further enables a high update rate of the scene illumination; for example, an update rate of 500 Hz is achievable for a high-resolution grid covering an entire target scene.

The combination of multiple laser sources across the target scene with small-angle scanning provides for a high degree of redundancy for a LiDAR sensor:

1) If one of the lasers of the pulsed laser array were to fail, all the other lasers still provide coverage throughout the target scene, with only a local region of the target scene affected; or
2) if the driving mechanism for the scan were to fail, the target depth information is still collected across the entire target scene, albeit with a lower spatial resolution.

For the sake of clarity, we will now describe first an example of a LiDAR sensor without a scanning capability, and then add a small-angle scanner to this LiDAR sensor.

A typical non-scanning LiDAR sensor comprises an array of pulsed lasers in a grid pattern as its light source. A pulsed laser array often utilized in LiDAR sensors is a VCSEL array. A typical VCSEL array comprises an array of 26×20 individually addressable lasers, with a pitch of 525 microns, a diameter of each individual laser of 300 microns, and a peak power of 100 W. Each laser pulse has typically a Gaussian, Lorentzian, or triangular shape as a function of time. However, embodiments of the present invention are not limited to VCSELs and can work with other types of pulsed laser arrays, as well, including both semiconductor lasers and non-semiconductor lasers. A lenslet array, as is known in the art, is registered with and fixed to the pulsed laser array in order to prepare the emitted beams for collimation by projection optics, and will in the following description be considered an integral part of the pulsed laser array.

The beams emitted from the pulsed laser array and projected by the lenslet array are intercepted by projection optics, which collimate and project the beams toward the target scene in a two-dimensional fan-like pattern, with an angular pitch between the collimated beams defined by the spatial pitch of the pulsed laser array and the focal length of the projection optics. An example is given by considering a pulsed laser array with a pitch of 525 microns (as described above), and projection optics with a focal length of 10 mm; this combination yields an angular pitch of beams of 3°.

The beams illuminate the target scene, and reflect from there to a receiver, usually adjacent to the light source of the LiDAR sensor. The receiver typically comprises a collection lens and a detector array, for example a SPAD (Single Photon Avalanche Diode) array or a range-gated CMOS (Complementary Metal Oxide Semiconductor) array, with the collection lens focusing the received beams onto the detector array. Control circuitry drives the pulsed laser array for timing the emission of the pulsed beams of each laser individually. The control circuitry also drives the receiver to synchronize it with the pulsed beams emitted by the pulsed laser array, measures the time of flight of the pulses reflected from the target scene, and thus enables the remote measurement of distance to each point on the target scene.

In the disclosed embodiments of the present invention, optical depth mapping apparatus comprises a LiDAR sensor (as described above), with the addition of a small-angle scanner and appropriate modifications to the control circuitry. The task of the small-angle scanner is to scan the angular array of laser beams in unison in small steps over a total scan range up to the angular pitch, or possibly as much as twice the angular pitch, of the laser beam array. The scanning action is typically a smooth movement, such as a sinusoidal movement, and the step-like scanning is achieved by activating the appropriate lasers to emit a pulse when the beam of each laser would point to an individual detector of the detector array of the LiDAR. However, alternative embodiments may comprise other scan movements, such as step-wise scanning or ramping to a given position. Denoting the angular pitch of the array of laser beams by $\alpha$, and the number of individual detectors covered by the scanner in one direction for one angular pitch by N, the angular resolution of the scanned array $\Delta\alpha$ will be $\Delta\alpha=\alpha/(N+1)$. As the scanner is typically capable of covering a large number of individual detectors over its scan range, the angular resolution $\Delta\alpha$ of the LiDAR will be much finer than the angular pitch $\alpha$ of the individual collimated laser beams.

For instance, for an angular pitch of $\alpha=3°$ and a number of scanned steps of N=20 over one angular pitch, the angular resolution of the scanned array is $\Delta\alpha=0.15°=2.5$ mrad. This angular resolution yields a spatial resolution of 50 cm on a target scene at a distance of 200 m, to be compared to a spatial resolution of 10 m for the same LiDAR sensor without angular scanning.

Typically, each laser illumination spot on the target scene is imaged onto an area of one sensing element in the detector array of the receiver, and the timing of the pulses of the scanned spot on the detector array is determined by the positions of the individual detectors. Alternatively, depending on application requirements, each laser illumination spot may be imaged onto two or more sensing elements. In alternative embodiments, the receiver may comprise a single, large-area time-of-flight sensing element. For these latter embodiments, the resolution of the depth map is determined by the emitter array and the scanner.

As will be detailed below, the disclosed embodiments of the present invention provide several alternatives for a small-angle scanner. The scanner may be located either before, within, or after the projection optics. The scanner may be either a separate addition to a non-scanning LiDAR sensor, or it may utilize elements of the LiDAR sensor, such as the projection optics. The small-angle scanner is driven by the same control circuitry as is used for driving the pulsed laser array and the receiver.

The first three of the following embodiments implement the scanning by moving the pulsed laser array and the projection optics of the LiDAR sensor relative to each other. These are also examples of the scanner utilizing components of the LiDAR sensor:

1) In a first embodiment, the scanner moves the projection optics transversely with respect to the central beam of the emitted array of beams. Moving the projection optics in two orthogonal directions, for example, scans the array of laser beams in these two orthogonal directions.

2) The second embodiment comprises moving the pulsed laser array transversely with respect to the beams.

3) The third embodiment comprises rotating the pulsed laser array around two orthogonal rotational axes, with both axes in the plane of the pulsed laser array.

Each of the three following embodiments implements the scanning using a separate assembly added to the non-scanning LiDAR sensor:

4) The fourth embodiment uses an electro-optical spatial light modulator to deflect the beams. An example of an electro-optical spatial light modulator comprises a transmissive liquid crystal diffraction grating positioned after the projection optics.

5) The fifth embodiment utilizes a Risley Prism, which comprises a pair of wedge prisms transverse to the emitted beams, rotated independently around the beams.

6) The sixth embodiment uses a rotating mirror to deflect the beams (e.g. a MEMS mirror).

System Description

FIG. 1 is a schematic side view of an optical apparatus 18 for depth mapping, in accordance with an embodiment of the invention. A pulsed laser array, such as a VCSEL array 20, comprising individual VCSELs 22 formed on a semiconductor substrate 23, emits pulsed beams 24 of radiation. A lenslet array 25, as is known in the art, is registered with and fixed to VCSEL array 20 for projecting pulsed beams 24 into beams 26 and adjusting their divergences for subsequent conversion to collimated beams. In this and subsequent figures, references to VCSEL array 20 include referring to lenslet array 25 as an integral part of VCSEL array 20, unless indicated otherwise. Ignoring the presence of a scanning assembly 34 for the time being, projection optics 27 receive beams 26 and collimate and direct them towards a target 28 as a two-dimensional fan-like array of collimated projected beams 30. The angular pitch between beams 30 is defined by the spatial pitch of VCSEL array 20 and the focal length of projection optics 27. The collimation of each projected beam 30 is determined by the combination of the divergence of pulsed beams 24 and the focal lengths of lenslet array 25 and projection optics 27. The focal length of projection optics 27 is determined by the pitch of VCSEL array 20 and the desired angular beam separation. The focal length of lenslet array 25 is chosen to compensate for the effect of projection optics 27 on projected beams 30, so as to ensure that projected beams 30 are collimated after they pass through projection optics 27.

The beams reflected from target 28 are received by a receiver 32, which measures the times of flight of the pulsed beams. Receiver 32 comprises, for example, a collection lens (not shown) and a detector array (not shown), typically a SPAD (Single Photon Avalanche Diode) array or a range-gated CMOS (Complementary Metal Oxide Semiconductor) array, with the collection lens focusing the beams received from target 28 onto the detector array. Receiver 32 is usually (although not necessarily) located adjacent to VCSEL array 20.

In the embodiments of the present invention that are described hereinbelow, projection optics 27 are illustrated for the sake of clarity as transmissive optics. Transmissive optics may comprise either a single lens with spherical surfaces, aspherical surfaces, or both, or a compound lens (e.g. a doublet), as is known in the art. Projection optics 27 may also comprise multi-element reflective or catadioptric optics, as are also known in the art.

Control circuitry 36 processes the times of flight measured by receiver 32 in order to generate a high resolution depth map of target 28. (Target 28 is shown here, for the sake of simplicity, as an abstract flat surface, but in general, the target that is mapped has a more complex and possibly dynamic topology.) The spatial resolution of this depth map is determined by the angular extent of and separation between the spots projected onto target 28 by projected beams 30.

In order to reach a resolution that is finer than the angular pitch defined by a static array of projected beams 30, the projected beams are intercepted by scanning assembly 34, which is driven by control circuitry 36 to scan projected beams 30 into angularly deviated beams 38 with a deviation that may be less than the angular pitch, or possibly up to twice the angular pitch, of the array of projected beams 30. Several possible embodiments of scanning assembly 34 are shown in the figures that follow, sharing the common characteristic that scanning assembly 34 is capable of scanning projected beams 30 angularly in unison with a high resolution over a total scan range up to the angular pitch, or possibly twice the angular pitch of the projected beams.

Control circuitry 36 also drives, in addition to scanning assembly 34, VCSEL array 20 and receiver 32. In some embodiments, individual VCSELs 22 are each separately driven by control circuitry 36 to emit a random or pseudo-random sequence of pulses, with a different sequence for each individual VCSEL 22. This produces a sparse pattern of pulses, varying randomly or pseudo-randomly both spatially and temporally, which reflect from target 28 back to receiver 32. The use of the resulting random or pseudo-random spatio-temporal patterns mitigates interference from other LiDAR sensors, which may be in the vicinity of optical apparatus 18. Restricting the spatial extent of the pattern to a sub-region of target 28 enables a rapid depth mapping by the LiDAR from a sub-region of interest.

Alternatively, control circuitry 36 may drive VCSEL array 20 to emit pulses in any suitable spatio-temporal pattern, including both regular patterns, such as a raster scan, and irregular patterns.

Scanning assembly 34 is positioned after projection optics 27 in the optical train shown in FIG. 1 solely for the purpose of describing optical apparatus 18 schematically and generically. Scanning assembly 34 may alternatively be located within or before projection optics 27, and it may share components with projection optics 27 or with the rest of optical apparatus 18, as illustrated in the embodiments that follow.

FIGS. 2-7 illustrate a number of alternative embodiments of the present invention, based on optical apparatus 18 shown in FIG. 1, with a different implementation of scanning assembly 34 in each embodiment. For the sake of clarity and simplicity, only a subset of four VCSELs 22 in VCSEL array 20 are shown to be emitting radiation in these figures. A right-handed Cartesian (xyz) coordinate system is displayed in the figures, with the z-axis pointing in the direction of a central, un-scanned beam in the optical apparatus, and the x- and y-axes defining a plane orthogonal to the z-axis. In general, VCSEL array 20 is oriented in the xy plane. This specific Cartesian coordinate system is used for convenience only, and other methods of defining directions may alternatively be used.

First Embodiment

Figure 2:
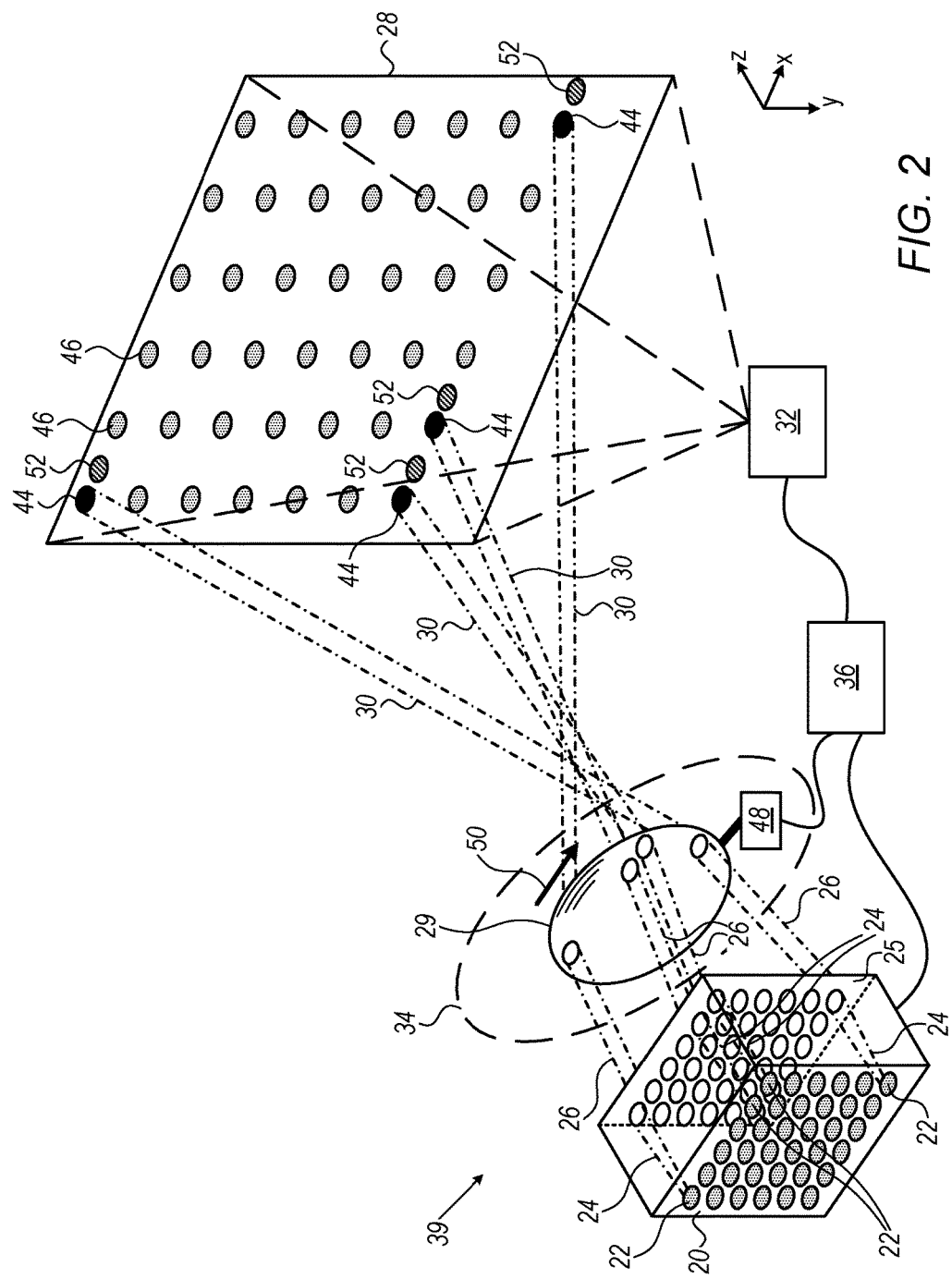
FIGS. 2-6 are schematic pictorial views of apparatus for depth mapping, in accordance with several embodiments of the invention.

FIG. 2 is a schematic pictorial view of apparatus 39 for depth mapping, in accordance with an embodiment of the invention. Four VCSELs 22 in VCSEL array 20 emit four pulsed beams 24 of radiation, which, as described with reference to FIG. 1, are projected by lenslet array 25 into beams 26. Beams 26 arrive at projection optics 27, which comprise a lens 29. Lens 29 further collimates and directs projected beams 30 to target 28. After reflection from the target, the beams are received by receiver 32 for measuring time of flight. Four projected beams 30 form four spots of radiation 44 on target 28. Spots 46 mark the positions where additional projected beams would illuminate target 28, were the remaining VCSELs in VCSEL array 20 also emitting radiation.

In the disclosed embodiment, scanning assembly 34 comprises lens 29 and a scanner 48, which is driven by control circuitry 36 and is physically connected to lens 29. Scanner 48 in this example comprises a two-axis linear translator with the axes of translation in the xy-plane. Scanning assembly 34 scans projected beams 30 by translating lens 29 with scanner 48 transversely with respect to the projected beams 30, for instance in a raster pattern. In general, by "translating transversely" we mean translation in the xy-plane.

In the example shown in FIG. 2, lens 29 is translated in the positive x-direction, as indicated by an arrow 50. The translation of the lens in the x-direction scans projected beams 30 angularly in unison in the xz-plane (primarily in the x-direction), shifting spots of radiation 44 to new locations 52. The direction and magnitude of the deviation of projected beams 30 are controlled, respectively, by the direction and magnitude of the translation of lens 29.

As an example of the required magnitude of movement of lens 29, we consider a full angular scan of one angular pitch of 3°, corresponding to a VCSEL array 20 with a pitch of 525 microns and lens 29 with a focal length of 10 mm. These parameters lead to a total required movement of 525 microns for lens 29. This kind of movement in two dimensions is easily attained with a high degree of reliability by implementing scanner 48, for example, using a stiff, two-axis linear flexure stage, driven by two piezoelectric translators. A high mechanical stiffness and the concomitant high mechanical resonance frequency are particularly desirable for consumer applications to ensure that the scanner is insensitive to mechanical shock and vibration.

Second Embodiment

Figure 3:
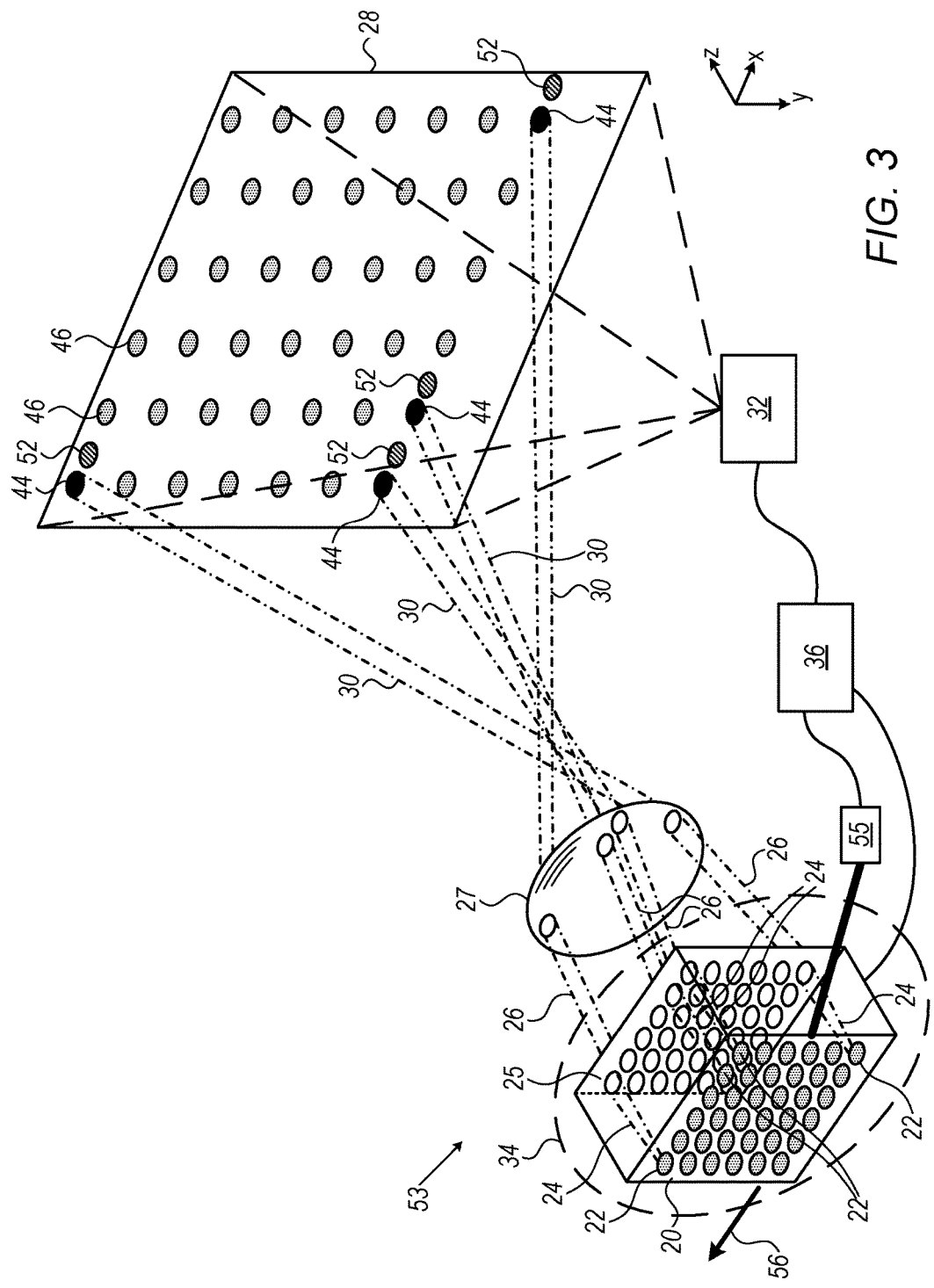

FIG. 3 is a schematic pictorial view of apparatus 53 for depth mapping, in accordance with another embodiment of the invention. In this and the subsequent figures, the pattern of VCSEL emission is identical to that shown in FIG. 2.

In the disclosed embodiment, scanning assembly 34 comprises VCSEL array 20 and a scanner 55, which is driven by control circuitry 36 and is physically connected to VCSEL array 20. Scanner 55 comprises a two-axis linear translator with the axes of translation in the xy-plane. Scanning assembly 34 scans projected beams 30 by translating VCSEL array 20 with scanner 55 transversely with respect to beams 24.

In FIG. 3 the translation takes place in the negative x-direction, as indicated by an arrow 56. The translation of VCSEL array 20 scans projected beams 30 angularly in unison in the xz-plane (primarily in the x-direction), which moves spots of radiation 44 to new locations 52. The direction and magnitude of the deviation of projected beams are controlled, respectively, by the direction and magnitude of the translation of VCSEL array 20.

Using again an example of VCSEL array 20 with a pitch of 525 microns and projection optics 27 with a focal length of 10 mm, a full angular scan of one angular pitch of 3° is achieved by a movement of 525 microns of VCSEL array 20, i.e. moving the VCSEL array by its own pitch. This movement is attained, similarly to FIG. 2, by implementing scanner 55, for example, using a two-axis linear flexure stage driven by piezoelectric translators.

Third Embodiment

Figure 4:
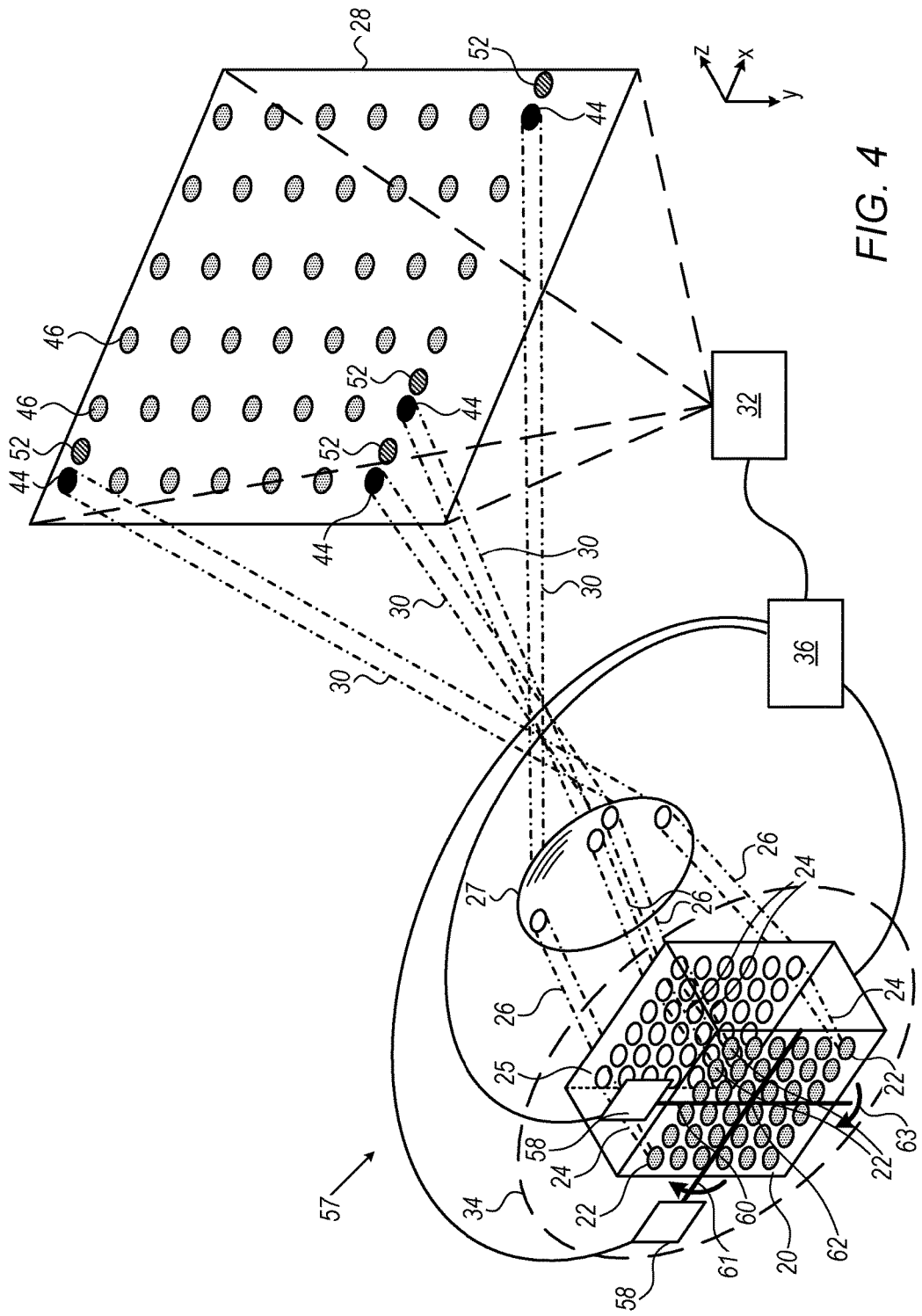

FIG. 4 is a schematic pictorial view of apparatus 57 for depth mapping, in accordance with another embodiment of the invention.

In the disclosed embodiment, scanning assembly 34 comprises VCSEL array 20 and scanner 58, which is driven by control circuitry 36 and is physically connected to VCSEL array 20. Scanner 58 comprises a two-axis rotational or tilt stage. Scanning assembly 34 scans projected beams 30 by rotating VCSEL array 20 by scanner 58 around two rotational axes 60 and 61. Rotational axes 60 and 61 in this example are located in the plane of VCSEL array 20 and aligned with the x- and y-axes, with a pivot point 62 centered on VCSEL array 20.

In FIG. 4 the rotation takes place around rotational axis 60 (the rotational axis parallel to y-direction), as indicated by an arrow 63. This rotation of VCSEL array 20 scans the projected beams angularly in unison in the xz-plane (primarily in the x-direction), shifting spots of radiation 44 to new locations 52. The direction and magnitude of the deviation of projected beams 30 are controlled, respectively, by the orientation of the compound axis of rotation and the magnitude of the rotation.

The angular scan of projected beams 30 is nominally equal to the rotation angle of VCSEL array 20. Thus, a 3° angular scan of one angular pitch of projected beams 30 requires a 3° rotation of VCSEL array 20, which can be easily attained by implementing scanner 58 using a two-axis flexure-based tilt-stage actuated by piezoelectric translators.

Fourth Embodiment

Figure 5:
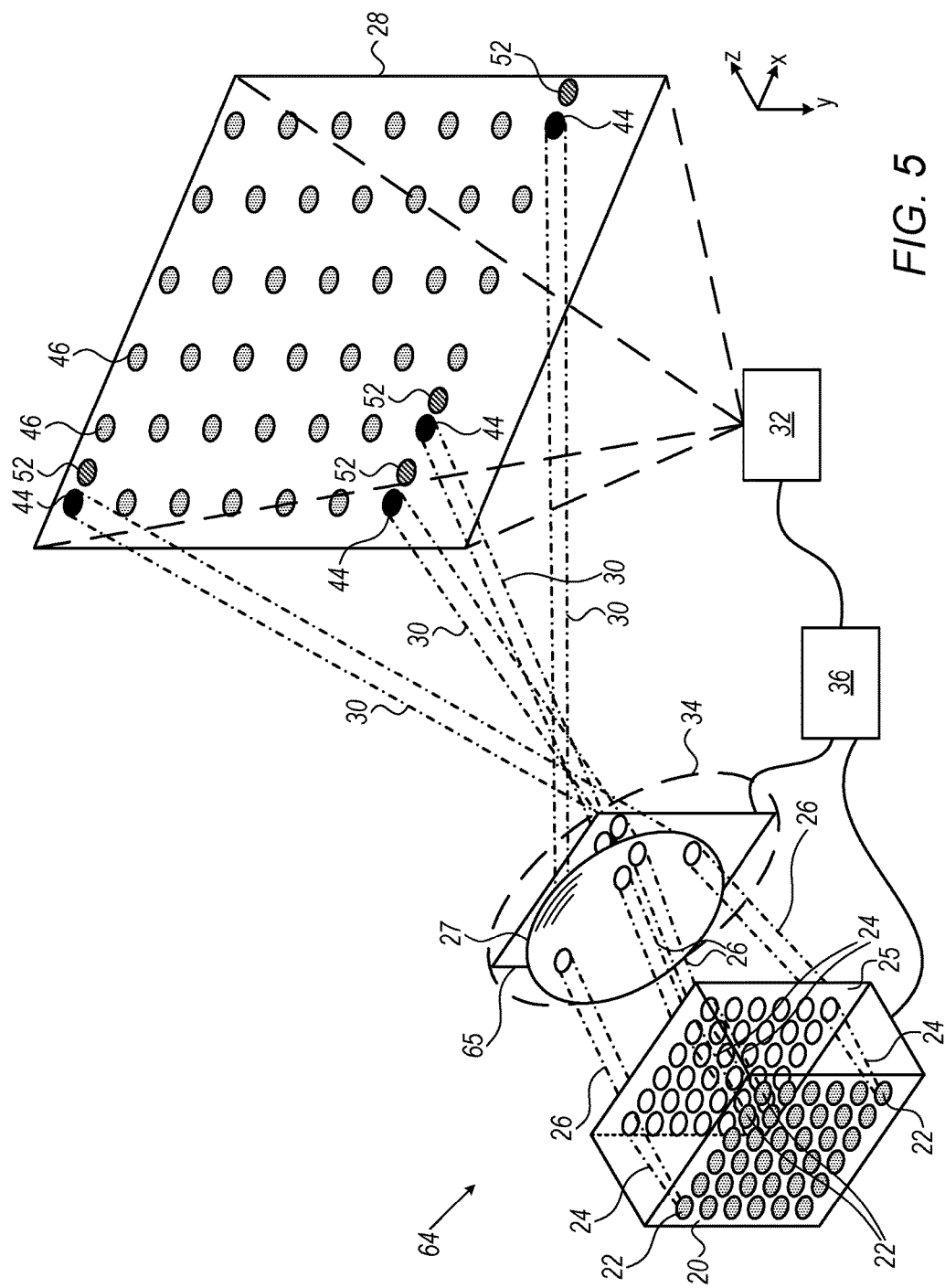

FIG. 5 is a schematic pictorial view of apparatus 64 for depth mapping, in accordance with another embodiment of the invention.

In the disclosed embodiment, scanning assembly 34 comprises a variable diffraction grating (not shown explicitly), which is implemented, for example, using a liquid crystal element 65 with suitable electrodes to serve as an electro-optical spatial light modulator, inserted between VCSEL array 20 and projection optics 27. Liquid crystal element 65 is driven by control circuit 36 (which also controls VCSEL array 20 and receiver 32) to provide a diffraction grating with a tunable period and variable orientation. Projected beams 30, which exit projection optics 27, enter liquid crystal element 65, and are deflected into a first diffraction order by the diffraction grating. The first diffraction orders of projected beams are scanned transversely by varying the period and orientation of the diffraction grating by control circuit 36. The orientation of the grating lines and the grating period, respectively, control the direction and magnitude of the deviation of projected beams 30. In FIG. 5, the grating lines are assumed to be oriented in the y-direction, which causes a deviation of the projected beams in the xz-plane (primarily in the x-direction), which in turn moves spots of radiation 44 to new locations 52.

The grating profile can be optimized to minimize losses into other diffractive modes, with diffraction efficiencies into first order of up to 70% achievable. A typical range of pitches for the diffraction grating in liquid crystal element 65 is 4 microns for a wavelength of 975 nm and a total scan range of one angular pitch of 3°. The requirements for liquid crystal element 65 can be estimated as follows: Consider VCSEL array 20 with a pitch of 525 microns and projection optics 27 with a focal length of 10 mm. A typical VCSEL will emit with a divergence of 18° for pulsed beam 24, resulting, after passing lenslet array 25 and projection optics 27, in projected beams 30 with a diameter 3 mm on liquid crystal element 65. For this beam diameter, liquid crystal element 65 with a pitch of 50 microns for its individual pixels must apply a linear phase delay in the scan direction of ±0.134 waves per pixel in order to introduce a tilt range of ±1.5°. This level of control is well within the capabilities of modern liquid crystal elements as well as other electro-optical spatial light modulators.

Fifth Embodiment

Figure 6:
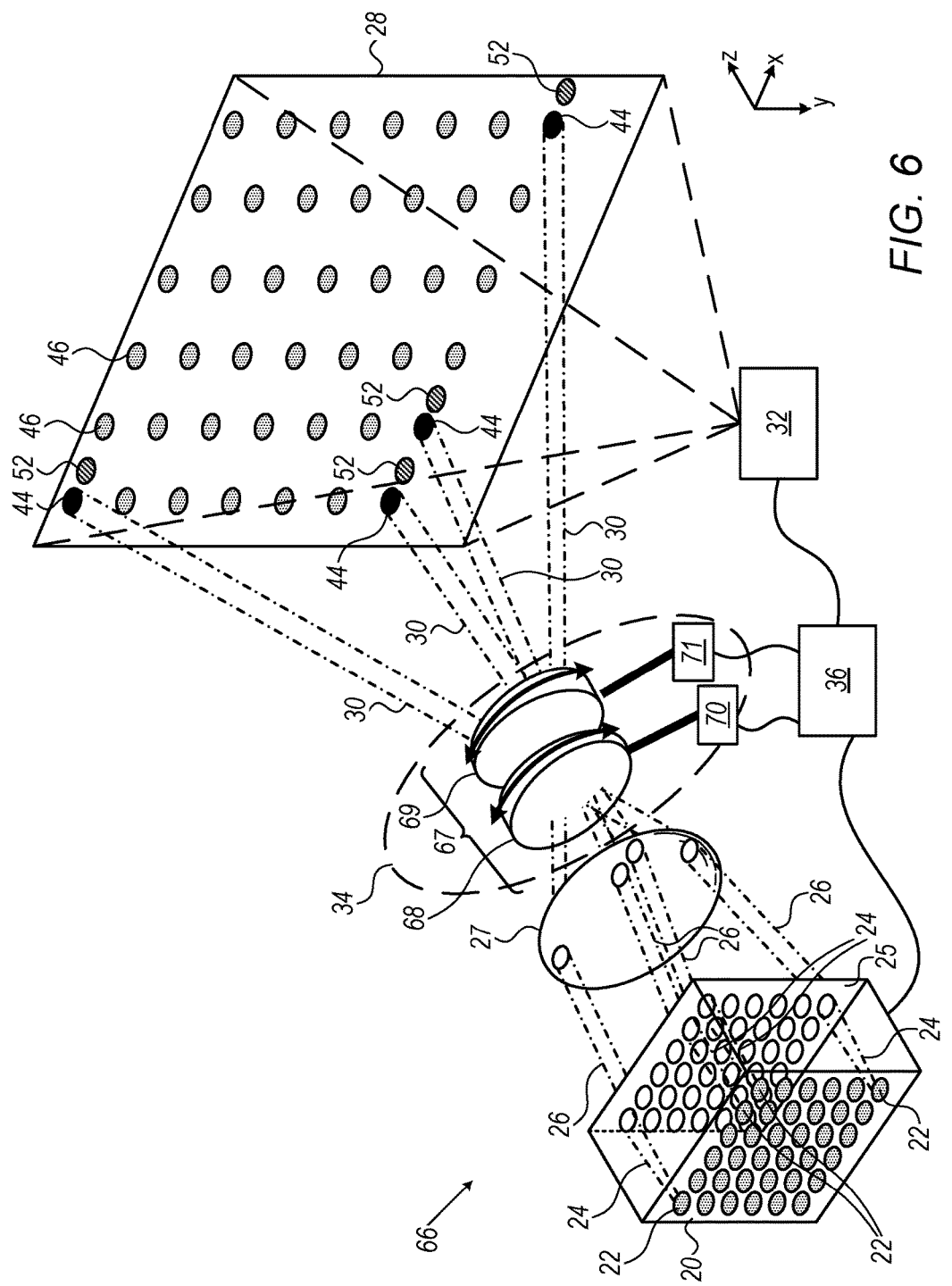

FIG. 6 is a schematic pictorial view of apparatus 66 for depth mapping, in accordance with another embodiment of the invention.

In the disclosed embodiment, scanning assembly 34 comprises a scanner 67, implemented using a Risley prism, which comprises two wedge prisms 68 and 69. Two rotational actuators 70 and 71 are connected, respectively, to wedge prisms 68 and 69, for rotating each of them independently around the z-axis. Wedge prisms 68 and 69 are oriented transversely to projected beams 30. Rotational actuators 70 and 71 are driven by control circuitry 36, which also controls VCSEL array 20 and receiver 32.

The scanning of projected beams 30 is accomplished by rotating wedge prisms 68 and 69, causing projected beams 30 to be deflected due to refraction at the surfaces of prisms 68 and 69. For given wedge angles of prisms 68 and 69, the direction and magnitude of the deviation of projected beams 30 is controlled by the rotational angles of the prisms. Each wedge will introduce an angular deviation of $\delta \approx \beta(n-1)$ for a refractive index of n and a wedge angle of $\beta$. With two fused silica wedged prisms with a refractive index of n=1.45 at a wavelength of 975 nm, typical wedge angles for wedges 68 and 69 are ~1° for a total angular scan range of ±1.5°, corresponding to a scan over one angular pitch of 3°.

Sixth Embodiment

Figure 7:
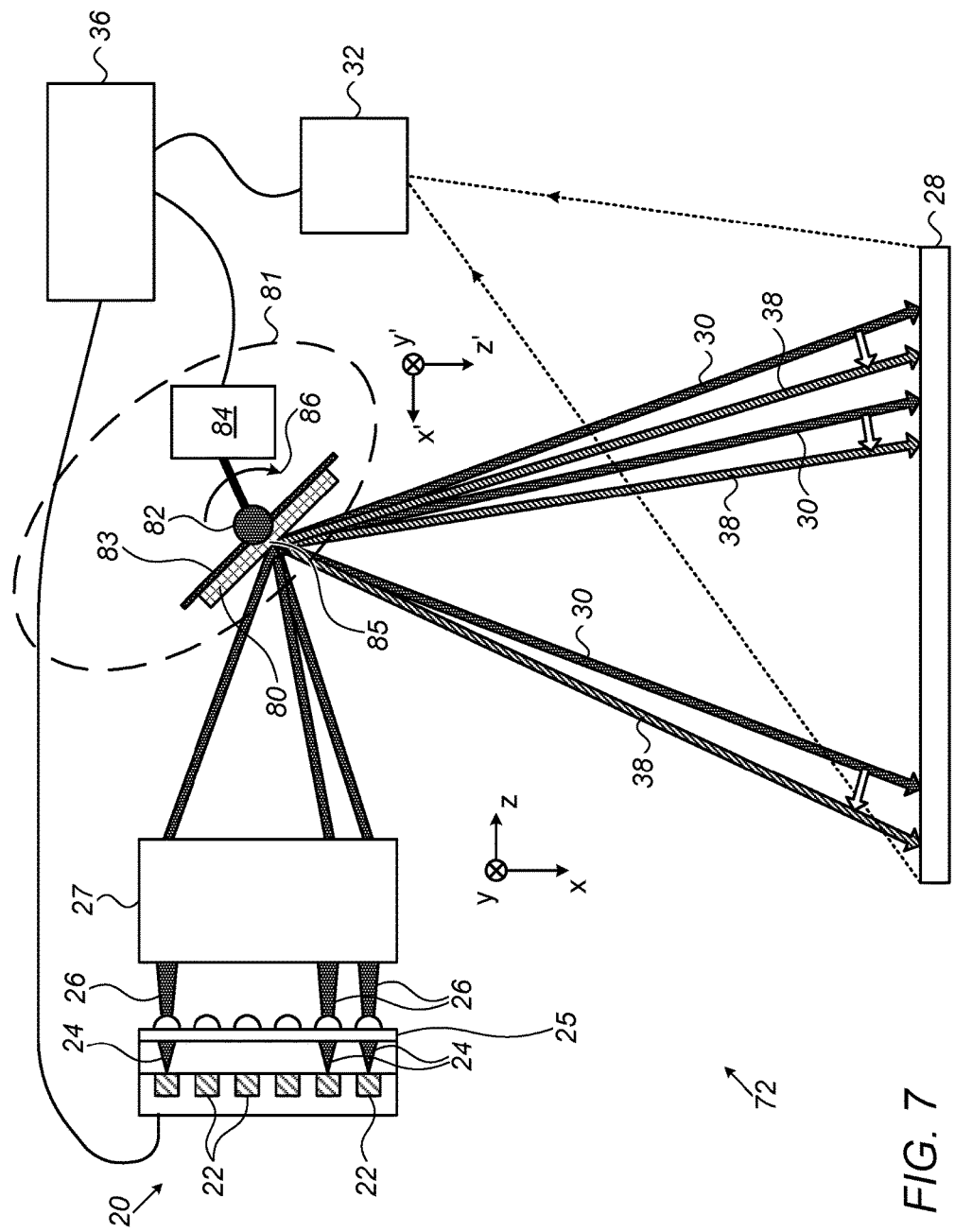
FIG. 7 is a schematic side view of apparatus for depth mapping, in accordance with yet another embodiment of the invention.

FIG. 7 is a schematic side view of apparatus 72 for depth mapping, in accordance with yet another embodiment of the invention. For the sake of clarity, FIG. 7 is drawn as a projection in the xz-plane, rather than as a perspective drawing as in FIGS. 2-6.

In the disclosed embodiment, scanner 81 (equivalent to scanning assembly 34 of the previous figures) comprises a mirror 80, which is rotated around two orthogonal axes 82 and 83 by a two-axis rotational actuator 84. Axes 82 and 83 are located in the plane of mirror 80, with the mirror pivoting around a pivot point 85 at its center. Rotational actuator 84 is driven by control circuitry 36, which also controls VCSEL array 20 and receiver 32.

Projection optics 27 collimate and direct projected beams 30 via mirror 80 to target 28, from where they are reflected to receiver 32 for measurement of time of flight. At the reflection from mirror 80, the Cartesian coordinate axes are rotated from coordinate axes xyz to coordinate axes x'y'z' so as to align the z'-axis with the new, reflected direction of the central (un-scanned) beam. The scanning of projected beams 30 is accomplished by rotating mirror 80 around orthogonal axes 82 and 83.

In FIG. 7 mirror 80 is rotated around axis 82 (which is parallel to the y-axis as well as to the y'-axis) as indicated by an arrow 86. The mirror rotation scans the multiple projected beams 30 in the x'z'-plane (primarily in the x'-direction) into angularly deviated beams 38. The direction and magnitude of the deviation of projected beams 30 is controlled, respectively, by the compound axis of rotation of mirror 80 and the magnitude of rotation around the axis.

A two-dimensional raster scan of projected beams 30 over their respective angular sub-regions is achieved by choosing axis 82 to be a fast rotation axis and axis 83 to be a slow rotation axis, and by rotating mirror 80 simultaneously around the two axes. The angular motions are typically sinusoidal; alternatively, the angular positions of mirror 80 can be advanced in steps or ramped to specific angular positions.

It is advantageous to position mirror 80 in the focal region of projection optics 27, as there collimated projected beams 30 overlap, and the size of the collective footprint of projected beams 30 reaches a minimum. The small footprint permits using a small mirror 80, typically a few millimeters in diameter, with the associated benefits of high speed and reliability. Moreover, the small size of mirror 80 facilitates attaining good optical quality across the entire mirror surface. One alternative for realizing mirror 80 is a two-axis MEMS mirror. These mirrors are manufactured using photolithography, which is well suited for high-volume manufacturing. A total angular scan of one angular pitch of 3° of projected beams 30 requires a 1.5° turning angle of mirror 80, which is well within the range of typical MEMS mirrors. The rotational mechanism of these mirrors is based on torsion bars, which are highly reliable for such small rotation angles.

Although the embodiments described above make use of certain, specific sorts of scanning assemblies, other sorts of scanning assemblies and mechanisms that can be used for these purposes will be apparent to those skilled in the art after reading the present description and are considered to be within the scope of the present invention. It will therefore be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Optical apparatus, comprising:
   an array of lasers, which are arranged in a grid pattern having a predefined spatial pitch and are configured to emit respective beams of pulses of optical radiation;
   projection optics having a selected focal length and configured to project the beams toward a target with an angular pitch between the beams defined by the spatial pitch and the focal length;
   a scanner, which is configured to scan the projected beams over a range of scan angles that is less than twice the angular pitch;
   control circuitry, which is coupled to drive the lasers to emit the pulses in a pseudo-random spatio-temporal pattern and to drive the scanner so that the pulses cover the target with a resolution finer than the angular pitch; and
   a receiver, which is configured to receive and measure a time of flight of the pulses reflected from the target.

2. The optical apparatus according to claim 1, wherein the array of lasers comprises:
   a semiconductor substrate; and
   an array of vertical-cavity surface-emitting lasers (VCSELs) formed on the substrate, which are configured to emit the optical radiation.

3. The optical apparatus according to claim 1, wherein the projection optics comprise a lens, and wherein the scanner is configured to scan the projected beams by translating the lens transversely with respect to the beams.

4. The optical apparatus according to claim 1, wherein the scanner is configured to scan the projected beams by applying a motion to the array of lasers relative to the projection optics.

5. The optical apparatus according to claim 4, wherein the motion comprises translating the array of lasers transversely relative to a direction of the beams.

6. The optical apparatus according to claim 4, wherein the motion comprises rotating the array of lasers around a rotational axis in a plane of the array of the lasers.

7. The optical apparatus according to claim 1, wherein the scanner comprises a rotating mirror positioned to deflect the projected beams at a variable deflection angle.

8. The optical apparatus according to claim 1, wherein the scanner comprises a grating positioned to diffract the beams at a variable diffraction angle.

9. The optical apparatus according to claim 7, wherein the grating comprises an electro-optical spatial light modulator, which is configured to generate the grating with a variable period and orientation.

10. The optical apparatus according to claim 1, wherein the scanner comprises at least one prism, which is positioned to intercept and refract the beams and is movable relative to the array so as to vary an angle of deviation of the refracted beams.

11. The optical apparatus according to claim 10, wherein the at least one prism comprises a pair of wedge prisms configured as a Risley prism.

12. A method of scanning, comprising:
    projecting, toward a target from an array of lasers arranged in a grid pattern, respective beams of pulses of optical radiation with a predefined angular pitch between the beams, while driving the lasers to emit the pulses in a pseudo-random spatio-temporal pattern;
    scanning the projected beams over a range of scan angles that is less than twice the angular pitch, while driving the lasers so that the pulses cover the target with a resolution finer than the angular pitch; and
    receiving and measuring a time of flight of the pulses reflected from the target.

13. The method according to claim 12, wherein the beams are projected through a lens, and wherein scanning the projected beams comprises translating the lens transversely with respect to the beams.

14. The method according to claim 12, wherein the beams are projected by projection optics, and wherein scanning the projected beams comprises applying a motion to the array of lasers relative to the projection optics.

15. The method according to claim 14, wherein applying the motion comprises applying at least one of a translation and a rotation to the array of the leasers.

16. The method according to claim 12, wherein scanning the projected beams comprises deflecting the beams at a variable deflection angle using a rotating mirror.

17. The method according to claim 12, wherein scanning the projected beams comprises diffracting the beams using a grating configured to diffract the beams with a variable diffraction angle.

18. The method according to claim 12, wherein scanning the projected beams comprises moving at least one prism through which the beams are transmitted so as to vary an angle of deviation of the beams.

\* \* \* \* \*